US009458756B2

(12) United States Patent
Arai (10) Patent No.: US 9,458,756 B2
(45) Date of Patent: Oct. 4, 2016

(54) COOLING DEVICE FOR ELECTRIC EQUIPMENT

(75) Inventor: Kunihiko Arai, Owariasahi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/357,980

(22) PCT Filed: Nov. 16, 2011

(86) PCT No.: PCT/JP2011/076397
§ 371 (c)(1),
(2), (4) Date: May 13, 2014

(87) PCT Pub. No.: WO2013/073019
PCT Pub. Date: May 23, 2013

(65) Prior Publication Data
US 2014/0284043 A1    Sep. 25, 2014

(51) Int. Cl.
*F28D 15/02* (2006.01)
*F01P 3/20* (2006.01)
(Continued)

(52) U.S. Cl.
CPC ............. *F01P 3/20* (2013.01); *B60H 1/00271* (2013.01); *B60K 11/02* (2013.01); *H01L 23/467* (2013.01);
(Continued)

(58) Field of Classification Search
CPC .............. H01M 10/6556; H01M 10/6551; H01M 10/663; H01M 10/625; H01M 10/613; H01M 10/651; F28D 15/02; F28D 15/025; F28D 2021/0028; F28D 2021/0029; H05K 7/20927; H05K 7/20936; H05K 7/20945; H05K 7/20254; H05K 7/20354; H05K 7/2039; H05K 7/205; H05K 7/20509; H05K 7/20845; H05K 7/20881; B60H 1/00271; B60H 1/00278; B60H 1/00392; B60H 1/00385; B60H 1/004; B60H 1/143; B60H 2001/00307; B60H 1/00807; B60H 1/00885; B60H 1/00949; B60H 1/02; B60H 2001/2246; B60H 2001/2253; B60H 2001/3242; B60H 2001/3255; B60H 2001/3263; B60H 2001/3266; F01P 3/20; F25B 2313/0252; F25B 2313/02521; F25B 2313/0253; F25B 2313/02531; F25B 2313/0254; F25B 2313/02541; F25B 41/0262
USPC ....................................................... 62/259.2
See application file for complete search history.

(56) References Cited

U.S. PATENT DOCUMENTS 4,007,315 A * 2/1977 Brinkmann ........ B60H 1/00278
429/120
5,878,589 A * 3/1999 Tanaka ............... B60H 1/00007
165/80.2

(Continued)

FOREIGN PATENT DOCUMENTS

CN    101606210 A    12/2009
EP    2 301 777 A1    3/2011
(Continued)

*Primary Examiner* — Len Tran
*Assistant Examiner* — For K Ling
(74) *Attorney, Agent, or Firm* — Oliff PLC (57) ABSTRACT

A cooling device for electric equipment includes a cooling unit for cooling an inverter element as a heat source. The cooling unit has a surface on which the inverter element is provided and a back surface disposed on a back side of surface, and includes a heat mass for transferring heat generated by the inverter element, an air-cooling fin provided on the back surface and radiating heat transferred through the heat mass, and an air-conditioner coolant pipeline provided on the surface and forming a coolant passage through which the coolant for vehicle cabin air-conditioning flows. With such configuration, a cooling device for electric equipment excellent in the cooling efficiency is achieved.

5 Claims, 6 Drawing Sheets

(51) Int. Cl.
- *B60K 11/02* (2006.01)
- *H01L 23/467* (2006.01)
- *H01L 23/473* (2006.01)
- *B60H 1/00* (2006.01)
- *H05K 7/20* (2006.01)
- *H01M 10/625* (2014.01)
- *H01M 10/663* (2014.01)
- *H01M 10/6556* (2014.01)
- *H01M 10/6551* (2014.01)
- *H01M 10/613* (2014.01)
- *B60K 1/00* (2006.01)
- *B60K 1/04* (2006.01)
- *H01M 10/651* (2014.01)

(52) U.S. Cl.
CPC .......... *H01L 23/473* (2013.01); *H01M 10/613* (2015.04); *H01M 10/625* (2015.04); *H01M 10/6551* (2015.04); *H01M 10/6556* (2015.04); *H01M 10/663* (2015.04); *H05K 7/20927* (2013.01); *B60H 2001/00307* (2013.01); *B60K 2001/003* (2013.01); *B60K 2001/0416* (2013.01); *H01L 2924/0002* (2013.01); *H01M 10/651* (2015.04); *H01M 2220/20* (2013.01)

(56) References Cited

U.S. PATENT DOCUMENTS

| | | | |
|---|---|---|---|
| 7,332,244 B2 * | 2/2008 | Uemoto | H01M 2/0202 429/149 |
| 2004/0035555 A1 | 2/2004 | Nara et al. | |
| 2008/0101013 A1 | 5/2008 | Nelson et al. | |
| 2008/0295535 A1 | 12/2008 | Robinet et al. | |
| 2009/0014162 A1 | 1/2009 | Nara et al. | |
| 2009/0130513 A1 | 5/2009 | Tsuchiya et al. | |
| 2010/0015512 A1 | 1/2010 | Inoue et al. | |
| 2011/0223457 A1 | 9/2011 | Lee et al. | |
| 2011/0269002 A1 * | 11/2011 | Kanata | H01M 2/0242 429/94 |

FOREIGN PATENT DOCUMENTS

| | | |
|---|---|---|
| JP | H06-24279 A | 2/1994 |
| JP | A-9-290622 | 11/1997 |
| JP | A-2002-270748 | 9/2002 |
| JP | A-2004-278840 | 10/2004 |
| JP | 2005-072542 A | 3/2005 |
| JP | 2005-086078 A | 3/2005 |
| JP | A-2005-90862 | 4/2005 |
| JP | A-2007-69733 | 3/2007 |
| JP | A-2008-94207 | 4/2008 |
| JP | A-2008-109131 | 5/2008 |

\* cited by examiner

| A/C COOLANT COOLING | MODE | FLOW RATE REGULATING VALVE 28 | VALVE 57 | VALVE 58 |
|---|---|---|---|---|
| ON | AIR-CONDITIONER OPERATION MODE | ADJUST SO THAT SUFFICIENT COOLANT FLOWS INTO COOLING UNIT 30 | FULLY OPENED | FULLY CLOSED |
|  | HEAT PIPE OPERATION MODE | FULLY CLOSED | FULLY CLOSED | FULLY OPENED |
| OFF |  |  | FULLY CLOSED | FULLY CLOSED |

|  | CONDITION1 | CONDITION2 | CONDITION3 | OPERATION OF A/C COOLANT COOLING |
|---|---|---|---|---|
| CASE1 | (T0−T1) ≦ β1 | NO DETERMINATION |  | ON |
| CASE2 | (T0−T1) > β1 | ASSIGN β2 FOR DETERMINATION |  | CASE4,5 |
| CASE3 | (T0−T1) > β1 | (T0−T1) > β2 | NO DETERMINATION | OFF |
| CASE4 | (T0−T1) > β1 | (T0−T1) ≦ β2 | THE CASE OF (T1−T2) ≦ θ1 | ON |
| CASE5 | (T0−T1) > β1 | (T0−T1) ≦ β2 | THE CASE OF (T1−T2) > θ1 | OFF |

FIG.11

COOLING DEVICE FOR ELECTRIC EQUIPMENT

TECHNICAL FIELD

The present invention generally relates to a cooling device for electric equipment mounted in a vehicle, more particularly to a cooling device for electric equipment which concurrently performs cooling with use of a vehicle cabin air-conditioning coolant and cooling with use of a fin structure.

BACKGROUND ART

With regard to a conventional cooling device for electric equipment, for example, Japanese Patent Laying-Open No. 2007-69733 (PTD 1) discloses a heat-generating body cooling system utilizing a vehicle air-conditioning device for the purpose of efficiently cooling a heat-generating body such as a battery or the like and improving heating performance. In the heat-generating body cooling system disclosed in PTD 1, a heat exchanger for performing heat exchange with air-conditioning air and a heat exchanger for performing heat exchange with the heat-generating body are arranged in parallel on a coolant passage extending from an expansion valve to a compressor, so that the heat-generating body is cooled utilizing a coolant for an air-conditioning device.

Further, Japanese Patent Laying-Open No. 2005-90862 discloses a cooling system for efficiently cooling HV equipment utilizing a vapor compression refrigeration cycle (PTD 2). In the cooling system disclosed in PTD 2, heat-generating body cooling means for cooling a heat-generating body is provided on a bypass passage bypassing a decompressor, an evaporator, and a compressor in a refrigeration cycle for air-conditioning.

Further, Japanese Patent Laying-Open No. 2008-109131 discloses a cooling system which is thermally efficient, completely provided in a semiconductor module, avoiding problems of contamination and leakage of fluid, and enabling easy attachment/replacement of the module (PTD 3). In the cooling system disclosed in PTD 3, an electric power device is provided in a recess demarcated in a housing. Coolant fluid actively circulates into the housing, and a pin fin is coupled to the housing.

Further, Japanese Patent Laying-Open No. 2002-270748 discloses a semiconductor module and an electrode conversion device which exhibits high cooling performance and achieves a high reliability by resolving the possibility of insulation breakdown due to a thermal stress which occurs during manufacturing and operation (PTD 4). In the semiconductor module disclosed in PTD 4, a conductor member having a flow passage is joined to a base plate. A power semiconductor element is joined to the conductor member by soldering.

CITATION LIST

Patent Document

PTD 1: Japanese Patent Laying-Open No. 2007-69733
PTD 2: Japanese Patent Laying-Open No. 2005-90862
PTD 3: Japanese Patent Laying-Open No. 2008-109131
PTD 4: Japanese Patent Laying-Open No. 2002-270748

SUMMARY OF INVENTION

Technical Problem

As disclosed in the patent documents described above, a technique of utilizing a vapor compression refrigeration cycle for air-conditioning of a vehicle cabin has been proposed as a cooling device for cooling electric equipment mounted in a vehicle. In such a cooling device, it is necessary to improve an efficiency of cooling electric equipment with use of a coolant for cabin air-conditioning to avoid deterioration of fuel consumption and lowering of air-conditioning performance of a vehicle.

Therefore, an object of the present invention is to solve the problem described above and provide a cooling device for electric equipment excellent in cooling efficiency.

Solution to Problem

A cooling device for electric equipment according to the present invention is a cooling device for electric equipment mounted in a vehicle. The cooling device for electric equipment includes a cooling unit for cooling a heat source included in electric equipment. The cooling unit includes a heat transfer member which has a first surface provided with a heat source and a second surface arranged on a back side of the first surface and transfers heat generated in the heat source, a fin portion which is provided at the second surface and radiates heat transferred through the heat transfer member, and a coolant passage forming member which is provided at the first surface and forms a coolant passage allowing a coolant for vehicle cabin air-conditioning to flow.

According to the cooling device for electric equipment configured in such a manner, heat which is generated at the heat source and transfers through the heat transfer member is radiated at the coolant passage forming member forming the coolant passage and at the fin portion. In this circumstance, since the coolant passage forming member and the fin portion are arranged on opposite sides across the heat transfer member, and the coolant passage forming member and the heat source are provided on the same side, the transfer of heat from the heat source to the coolant passage forming member can be prompted while the heat transfer from the fin portion to the coolant passage forming member is suppressed. Accordingly, the efficiency of cooling electric equipment can be improved.

Preferably, the cooling device for electric equipment further includes a circulation passage which constitutes a vapor compression refrigeration cycle and allows a coolant for vehicle air-conditioning to circulate, a communication passage which allows communication between the circulation passage and the coolant passage, and a switching valve which is provided on a route of the communication passage and permits or blocks a coolant flow between the circulation passage and the coolant passage.

According to the cooling device for electric equipment configured in such a manner, cooling with use of a coolant for vehicle cabin air-conditioning can be utilized selectively through operation of the switching valve.

Preferably, the control device for electric equipment further includes a first temperature measurement unit for measuring a temperature of the heat source, a second temperature measurement unit for measuring a temperature of the heat transfer member, and a controller which controls operation of the switching valve based on a temperature T0 of the heat source and a temperature T1 of the heat transfer member which are measured respectively at the first temperature measurement unit and the second temperature measurement unit. The controller allows a switching valve to operate so that a coolant flow between the circulation passage and the coolant passage is permitted when a value of T0−T1 is less than or equal to β1 (β1 is a preset threshold value).

According to the cooling device for electric equipment configured in such a manner, when a difference between temperature T0 of the heat source and temperature T1 of the heat transfer member is less than or equal to preset threshold value β1, it is determined that a temperature gradient from the heat source to the heat transfer member is not sufficient, and cooling with use of the coolant for vehicle cabin air-conditioning is added. Accordingly, as compared with the case where cooling with use of the coolant for vehicle cabin air-conditioning is always utilized, the utilization efficiency of energy can be improved.

Preferably, the cooling device for electric equipment further includes a second temperature measurement unit for measuring a temperature of the heat transfer member, a third temperature measurement unit for measuring a temperature of the fin portion, and a controller which controls operation of the switching valve based on a temperature T1 of the heat transfer member and a temperature T2 of the fin portion which are measured respectively at the second temperature measurement unit and the third temperature measurement unit. The controller allows the switching valve to operate so that a coolant flow between the circulation passage and the coolant passage is permitted when a value of T1−T2 is less than or equal to θ1 (θ1 is a preset threshold value).

According to the cooling device for electric equipment configured in such a manner, when a difference between temperature T1 of the heat transfer member and temperature T2 of the fin portion is less than or equal to preset threshold value θ1, it is determined that a temperature gradient from the heat transfer member to the fin portion is not sufficient, and cooling with use of a coolant for vehicle cabin air-conditioning is added. Accordingly, as compared with the case where cooling with use of the coolant for vehicle cabin air-conditioning is always utilized, the utilization efficiency of energy can be improved.

Preferably, the fin portion is formed to protrude from the second surface. The third temperature measurement unit is provided at a leading end of the fin portion protruding from the second surface.

According to the cooling structure for electric equipment configured in such a manner, when the coolant for vehicle cabin air-conditioning flows through the coolant passage, the temperature of the fin portion can be measured while overcoming the influence of cooling by the coolant.

Preferably, the electric equipment includes a plurality of heat sources. The coolant passage forming member is arranged between a plurality of said heat sources which are arranged adjacent to each other.

According to the cooling structure for electric equipment configured in such a manner, the plurality of heat sources can be cooled more uniformly, Advantageous Effects of Invention As described above, according to the present invention, a cooling device for electric equipment excellent in cooling efficiency can be provided.

DESCRIPTION OF EMBODIMENT

The embodiment of the present invention will be described with reference to the drawings. In the drawings which will be referred in the following, the same or corresponding parts have the same reference numerals allotted.

Figure 1:
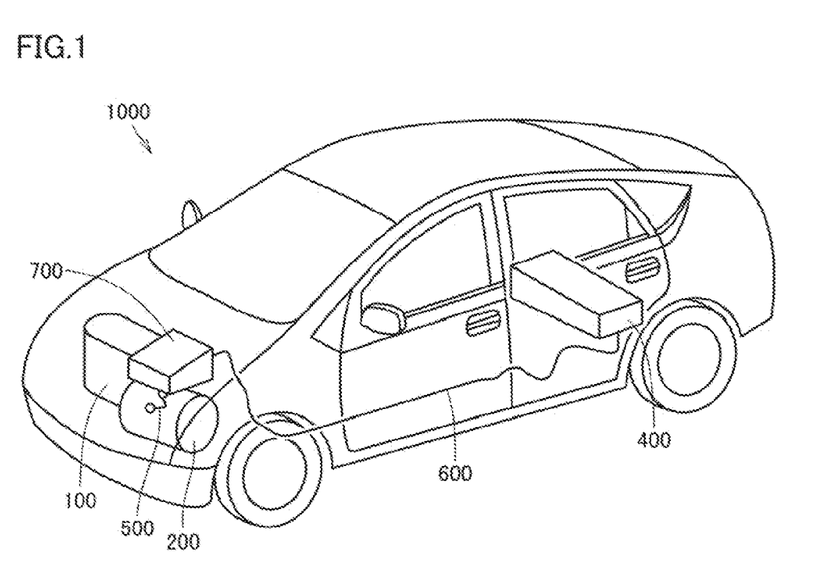
FIG. 1 schematically represents a vehicle to which a cooling device for electric equipment according to the embodiment of the present invention is applied.

FIG. 1 schematically represents a vehicle to which a cooling device for electric equipment according to the embodiment of the present invention is applied.

A vehicle 1000 is a hybrid vehicle having an engine 100 serving as an internal combustion engine, a drive unit 200 serving as an electric motor, a PCU (Power Control Unit) 700, and a driving battery 400, and using engine 100 and drive unit 200 as a power sources.

Engine 100 may be a gasoline engine or a diesel engine. Drive unit 200 generates driving force for driving vehicle 1000 together with engine 100. Engine 100 and drive unit 200 each are provided within an engine room of vehicle 1000. Drive unit 200 is electrically connected to PCU 700 through a cable 500. PCU 700 is electrically connected to driving battery 400 through a cable 600.

Figure 2:
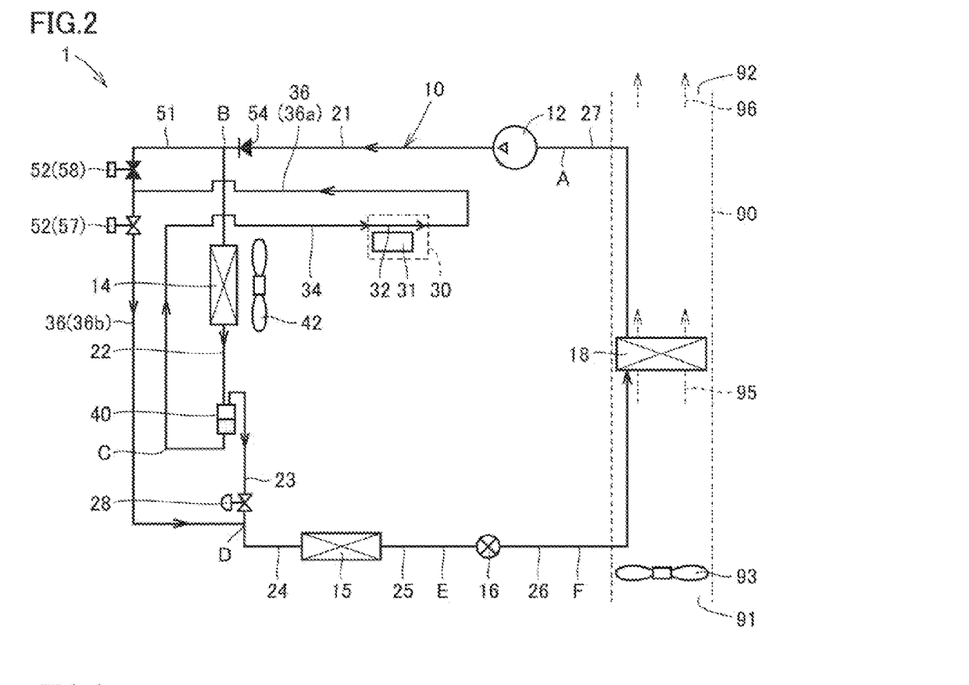
FIG. 2 schematically represents a configuration of a cooling device for electric equipment according to the embodiment of the present invention.

FIG. 2 schematically represents a configuration of a cooling device for electric equipment according to the embodiment of the present invention.

Referring to FIG. 2, the cooling device for electric equipment according to the present embodiment includes a vapor compression refrigeration cycle 10. Vapor compression refrigeration cycle 10 is mounted on vehicle 1000, for example, to perform cooling in a vehicle cabin. The cooling with use of vapor compression refrigeration cycle 10 is performed, for example, when a switch for performing cooling is turned on, or when an automatic control mode for automatically adjusting the temperature in the vehicle cabin at a set temperature is selected and the temperature in the vehicle cabin is higher than the set temperature.

Vapor compression refrigeration cycle 10 includes a compressor 12, a heat exchanger 14 as the first heat exchanger, a heat exchanger 15, an expansion valve 16 as an example of a decompressor, and a heat exchanger 18 as the second heat exchanger. Vapor compression refrigeration cycle 10 includes a gas-liquid separator 40 arranged on the route of the coolant between heat exchanger 14 and heat exchanger 15.

Compressor 12 operates with a motor or an engine mounted on a vehicle as a power source and adiabatically compresses the coolant gas to obtain superheated coolant gas. Compressor 12 takes in and compresses a coolant flowing from heat exchanger 18 during operation of vapor compression refrigeration cycle 10, and then discharges a high-temperature and high-pressure gas-phase coolant to a coolant passage 21. Compressor 12 discharges the coolant to coolant passage 21 to allow circulation of the coolant through vapor compression refrigeration cycle 10.

Heat exchangers 14 and 15 allow superheated coolant gas compressed by compressor 12 to radiate heat isobarically an external medium to obtain a coolant liquid. The high-pressure gas-phase coolant discharged from compressor 12 is condensed (liquefied) by radiating heat to a periphery of heat exchangers 14 and 15 for cooling. Heat exchangers 14 and 15 each include a tube through which the coolant flows, and a fin for performing heat exchange between the coolant flowing through the tube and air around heat exchangers 14 and 15.

Heat exchangers 14 and 15 perform heat exchange between cooling air and the coolant. The cooling air may be supplied to heat exchangers 14 and 15 by natural draft generated by vehicle running. Alternatively, the cooling air may be supplied to heat exchangers 14 and 15 by forced draft from a cooling fan such as a condenser tin 42 or a radiator fan for cooling the engine. The heat exchange performed in heat exchangers 14 and 15 lowers the temperature of the coolant to liquefy the coolant.

Expansion valve 16 allows the high-pressure liquid-phase coolant flowing through coolant passage 25 to be sprayed from a small hole for expansion to achieve a low-temperature, low-pressure mist-like coolant. Expansion valve 16 decompresses the coolant liquid condensed by heat exchangers 14 and 15 to obtain moist vapor in a gas-liquid mixed state. The decompressor for decompressing the coolant liquid is not limited to expansion valve 16 performing throttle expansion but may also be a capillary tube.

By evaporation of the mist-like coolant flowing through heat exchanger 18, this heat exchanger 18 absorbs heat of ambient air introduced so as to come in contact with heat exchanger 18. Heat exchanger 18 uses the coolant decompressed by expansion valve 16 to absorb heat of evaporation, caused when moist vapor of the coolant is evaporated to become coolant gas, from air-conditioning air flowing into the vehicle cabin, so that the vehicle cabin is cooled. The air-conditioning air with a temperature lowered due to absorption of heat by heat exchanger 18 is returned again into the vehicle cabin, so that the vehicle cabin is cooled. In heat exchanger 18, the coolant absorbs heat from its surroundings and is then heated.

Heat exchanger 18 includes a tube through which the coolant flows, and a fin for performing heat exchange between the coolant flowing through the tube and the ambient air of heat exchanger 18. The coolant in the moist vapor state flows through the tube. When flowing through the tube, the coolant is evaporated by absorbing heat of the air in the vehicle cabin via the fin as latent heat of evaporation, and then turned into superheated vapor by sensible heat. The evaporated coolant flows into compressor 12 via coolant passage 27. Compressor 12 compresses the coolant flowing from heat exchanger 18.

Vapor compression refrigeration cycle 10 further includes a coolant passage 21 allowing communication between compressor 12 and heat exchanger 14, coolant passages 22, 23, and 24 allowing communication between heat exchanger 14 and heat exchanger 15, a coolant passage 25 allowing communication between heat exchanger 15 and expansion valve 16, a coolant passage 26 allowing communication between expansion valve 16 and heat exchanger 18, and a coolant passage 27 allowing communication between heat exchanger 18 and compressor 12.

Coolant passage 21 is a passage for causing the coolant to flow from compressor 12 to heat exchanger 14. The coolant flows between compressor 12 and heat exchanger 14 from an outlet of compressor 12 toward an inlet of heat exchanger 14 via coolant passage 21. Coolant passages 22 to 25 each are a passage for causing the coolant to flow from heat exchanger 14 to expansion valve 16. The coolant flows between heat exchanger 14 and expansion valve 16 from an outlet of heat exchanger 14 toward an inlet of expansion valve 16 via coolant passages 22 to 25.

Coolant passage 26 is a passage for causing the coolant to flow from expansion valve 16 to heat exchanger 18. The coolant flows between expansion valve 16 and heat exchanger 18 from an outlet of expansion valve 16 to the inlet of heat exchanger 18 via coolant passage 26. Coolant passage 27 is a passage for causing the coolant to flow from heat exchanger 18 to compressor 12. The coolant flows between heat exchanger 18 and compressor 12 from the outlet of heat exchanger 18 to an inlet of compressor 12 via coolant passage 27.

Vapor compression refrigeration cycle 10 is configured by compressor 12, heat exchangers 14 and 15, expansion valve 16, and heat exchanger 18 coupled via coolant passages 21 to 27. In addition, the coolant used for vapor compression refrigeration cycle 10 may be carbon dioxide, hydrocarbon such as propane and isobutane, ammonia, fluorocarbons water or the like, for example.

Gas-liquid separator 40 is provided on a coolant route between heat exchanger 14 and heat exchanger 15. Gas-liquid separator 40 separates the coolant flowing out of heat exchanger 14 into a gas-phase coolant and a liquid-phase coolant. Gas-liquid separator 40 stores coolant liquid that is a liquid-phase coolant and coolant vapor that is a gas-phase coolant. Coolant passages 22 and 23 and coolant passage 34 are coupled to gas-liquid separator 40.

On the outlet side of heat exchanger 14, the coolant is in the state of moist vapor in the gas-vapor two-phase state where saturation liquid and saturated vapor are mixed. The coolant flowing out of heat exchanger 14 is supplied to gas-liquid separator 40 through coolant passage 22. The coolant in the gas-liquid two-phase state that flows through coolant passage 22 into gas-liquid separator 40 is separated within gas-liquid separator 40 into a gas phase and a liquid phase. Gas-liquid separator 40 separates the coolant condensed by heat exchanger 14 into coolant liquid in the liquid state and coolant vapor in the gaseous state, and temporarily stores them.

The separated coolant liquid flows through coolant passage 34 to the outside of gas-liquid separator 40. Coolant passage 34 has an end disposed in the liquid phase within gas-liquid separator 40 and forming an outlet for the liquid-phase coolant flowing out of gas-liquid separator 40. The separated coolant vapor flows through coolant passage 23 to the outside of gas-liquid separator 40. Coolant passage 23 has an end disposed in the gas phase within gas-liquid separator 40 and forming an outlet for the gas-phase coolant flowing out of gas-liquid separator 40. The gas-phase coolant vapor derived from gas-liquid separator 40 radiates heat into the ambient environment in heat exchanger 15 serving as a third heat exchanger, thereby being cooled and condensed.

Within gas-liquid separator 40, the coolant liquid accumulates in the lower portion while the coolant vapor accumulates in the upper portion. Coolant passage 34 has an end through which the coolant liquid flows out of gas-liquid separator 40. This end is coupled to the bottom of gas-liquid separator 40. Only the coolant liquid is caused to flow from the bottom side of gas-liquid separator 40 through coolant passage 34 to the outside of gas-liquid separator 40. Coolant passage 23 has an end through which the coolant vapor flows out of gas-liquid separator 40. This end is coupled to the ceiling part of gas-liquid separator 40. Only the coolant vapor is caused to flow from the ceiling side of gas-liquid separator 40 through coolant passage 23 to the outside of gas-liquid separator 40. Consequently, gas-liquid separator 40 can reliably carry out separation between the gas-phase coolant and the liquid-phase coolant.

The route through which the coolant flows from the outlet of heat exchanger 14 toward the inlet of expansion valve 16 includes coolant passage 22 extending from the outlet side of heat exchanger 14 to gas-liquid separator 40, a coolant passage 23 through which the coolant vapor flows out of gas-liquid separator 40 through flow rate regulating valve 28 described later, a coolant passage 24 coupled to the inlet side of heat exchanger 15, and a coolant passage 25 through which the coolant flows from the outlet side of heat exchanger 15 to expansion valve 16. Coolant passage 23 is a passage through which the gas-phase coolant separated in gas-liquid separator 40 flows.

The route of the coolant flowing between heat exchangers 14 and 15 further includes a coolant passage 34 allowing communication between gas-liquid separator 40 and cooling unit 30, and a coolant passage 36 allowing communication between cooling unit 30 and coolant passage 24. The coolant liquid flows from gas-liquid separator 40 through coolant passage 34 into cooling unit 30. The coolant having passed through cooling unit 30 flows through coolant passage 36 and returns to coolant passage 24. Cooling unit 30 is provided on the route of the coolant that flows from heat exchanger 14 toward heat exchanger 15.

A point D shown in FIG. 2 indicates a connection point of coolant passage 23, coolant passage 24 and coolant passage 36. Specifically, point D indicates the end of coolant passage 23 on the downstream side (on the side close to heat exchanger 15), the end of coolant passage 24 on the upstream side (on the side close to heat exchanger 14), and the end of coolant passage 36 on the downstream side. Coolant passage 23 forms a part of the route extending from gas-liquid separator 40 to point D, through which the coolant flows from gas-liquid separator 40 to expansion valve 16.

The cooling device for electric equipment according to the present embodiment includes a coolant route arranged in parallel with coolant passage 23 and cooling unit 30 is disposed on this coolant route. Cooling unit 30 is provided on one of a plurality of passages connected in parallel in the route of the coolant flowing from gas-liquid separator 40 toward heat exchanger 15 between heat exchanger 14 and expansion valve 16. Cooling unit 30 includes EV (Electric Vehicle) equipment 31 that is electric equipment mounted in a vehicle, and a coolant passage 32 through which the coolant for vehicle cabin air-conditioning flows. EV equipment 31 includes a heat source which generates heat during operation thereof. One end of coolant passage 32 is connected to coolant passage 34. The other end of coolant passage 32 is connected to coolant passage 36.

The coolant route connected in parallel with coolant passage 23 between gas-liquid separator 40 and point D shown in FIG. 2 includes coolant passage 34 on the upstream side of cooling unit 30 (on the side close to gas-liquid separator 40), coolant passage 32 included in cooling unit 30, and coolant passage 36 on the downstream side of cooling unit 30 (on the side close to heat exchanger 15). Coolant passage 34 is a passage through which the liquid-phase coolant to flows from gas-liquid separator 40 to cooling unit 30. Coolant passage 36 is a passage through which the coolant flows from cooling unit 30 to point D. Point D is a branch point between coolant passages 23, 24 and coolant passage 36.

The coolant liquid flowing out of gas-liquid separator 40 flows through coolant passage 34 toward cooling unit 30. The coolant flowing into cooling unit 30 and flowing through coolant passage 32 absorbs heat from the heat source included in EV equipment 31 as electric equipment to thereby cool EV equipment 31. Cooling unit 30 cools EV equipment 31 using the liquid-phase coolant that is separated in gas-liquid separator 40 and flows through coolant passage 34 into coolant passage 32. In cooling unit 30, heat exchange between the coolant flowing through coolant passage 32 and the heat source included in EV equipment 31 is performed, thereby cooling EV equipment 31 and heating the coolant. The coolant further flows from cooling unit 30 through coolant passage 36 toward point D, and reaches heat exchanger 15 through coolant passage 24.

Cooling portion 30 is provided so as to have a structure that allows heat exchange between EV equipment 31 and the coolant to be performed in coolant passage 32. Details as to the structure of cooling unit 30 will be described later.

EV equipment 31 is disposed outside of coolant passage 32. In this case, EV equipment 31 does not interfere with a flow of the coolant flowing through coolant passage 32. Therefore, since a pressure loss of vapor compression refrigeration cycle 10 does not increase. EV equipment 31 can be cooled without increasing the motive power of compressor 12.

EV equipment 31 is electric equipment involving generating heat by supply and reception of electric power. The electric equipment includes, for example, at least any one of an inverter for converting direct-current power to alternate-current power, a motor generator as a rotating electric machine, a battery as a storage device, a boost converter for boosting the voltage of the battery, and a DC/DC converter for stepping down the voltage of the battery. The battery is, for example, a rechargeable battery such as a lithium-ion battery, a nickel-metal hydride battery, or the like. In place of the battery, a capacitor may be employed.

Heat exchanger 18 is disposed within a duct 90 through which air flows. Heat exchanger 18 performs heat exchange between the coolant and the air-conditioning air flowing through duct 90 to adjust the temperature of the air-conditioning air. Duct 90 includes a duct inlet 91 serving as an inlet through which the air-conditioning air flows into duct 90 and a duct outlet 92 serving as an outlet through which the air-conditioning air flows out of duct 90. A fan 93 is disposed in the vicinity of duct inlet 91 within duct 90.

By driving fan 93, air flows through duct 90. When fan 93 operates, air-conditioning air flows through duct inlet 91 into duct 90. The air flowing into duct 90 may be outside air, or may be air within the vehicle cabin. An arrow 95 in FIG. 2 indicates the flow of the air-conditioning air that flows through heat exchanger 18 and is subjected to heat exchange with the coolant in vapor compression refrigeration cycle 10. During the cooling operation, the air-conditioning air is cooled in heat exchanger 18, and the coolant is heated by heat transfer from the air-conditioning air. An arrow 96 indicates the flow of the air-conditioning air that has a temperature adjusted by heat exchanger 18 and flows out of duct 90 through duct outlet 92.

The coolant passes through a coolant circulating flow passage including compressor 12, heat exchangers 14 and 15, expansion valve 16, and heat exchanger 18 sequentially connected by coolant passages 21 to 27, and circulates in vapor compression refrigeration cycle 10. The coolant flows through vapor compression refrigeration cycle 10 so as to sequentially pass through points A, B, C, D, E, and F shown in FIG. 2. Thus, the coolant circulates through compressor 12, heat exchangers 14 and 15, expansion valve 16, and heat exchanger 18.

Figure 3:
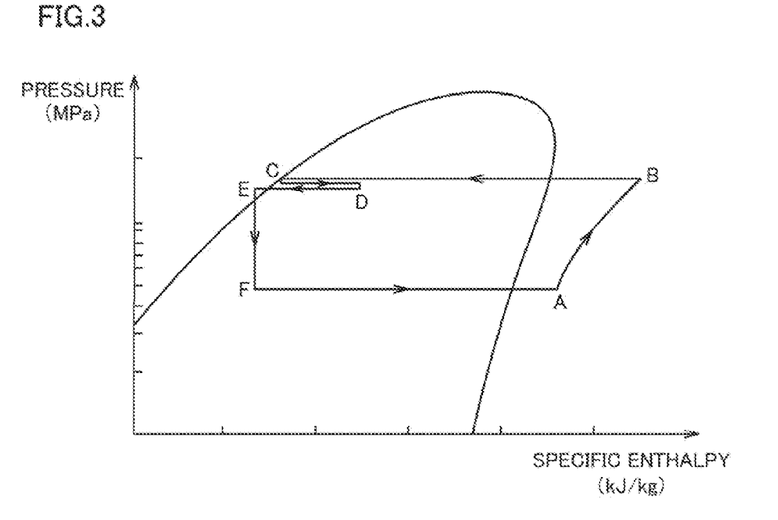
FIG. 3 is a Mollier diagram representing a state of a coolant in the vapor compression refrigeration cycle of FIG. 2.

FIG. 3 is a Mollier diagram showing the state of the coolant in the vapor compression refrigeration cycle in FIG. 2. In FIG. 3, the horizontal axis denotes a specific enthalpy of the coolant while the vertical axis denotes an absolute pressure of the coolant. The unit of the specific enthalpy is kJ/kg and the unit of the absolute pressure is MPa. The curve shown in the figure is a saturated vapor line and a saturated liquid line of the coolant.

FIG. 3 represents a thermal dynamic state of the coolant at each point (that is, points A, B, C, D, E, and F) in vapor compression refrigeration cycle 10 that flows from coolant passage 22 at the outlet of heat exchanger 14 into coolant passage 34 via gas-liquid separator 40, cools EV equipment 31, and returns from coolant passage 36 to coolant passage 24 at the inlet of heat exchanger 15 via point D. The route through which the coolant flows at this time, that is, coolant passage 21, coolant passage 22, coolant passage 34, coolant passage 36, and coolant passages 24 to 27, forms the first passage.

Referring to FIG. 3, the coolant in the superheated state taken into compressor 12 (point MA is adiabatically compressed along an isentropic line in compressor 12. As the compression progresses, the coolant rises in pressure and temperature, turns into high-temperature and high-pressure superheated vapor with a high degree of superheat (point B), and flows into heat exchanger 14. The gas-phase coolant discharged from compressor 12 radiates heat into the ambient environment in heat exchanger 14, thereby being cooled and then condensed (liquefied). By heat exchange with the outside air in heat exchanger 14, the coolant is lowered in temperature and liquefied. The high-pressure coolant vapor having entered into heat exchanger 14 turns into dry saturated vapor from superheated vapor while maintaining equal pressure in heat exchanger 14, radiates latent heat of condensation and is gradually liquefied, and then, turns into moist vapor in the gas-liquid mixed state. Among the coolants in the gas-liquid two-phase state, the condensed coolant is in the saturated liquid state (point C).

The coolant is separated into a gas-phase coolant and a liquid-phase coolant in gas-liquid separator 40. Among the coolants separated into a gas-phase coolant and a liquid-phase coolant, the liquid-phase coolant liquid flows from gas-liquid separator 40 through coolant passage 34 into coolant passage 32 of cooling unit 30, to cool EV equipment 31. In cooling unit 30, heat is radiated into the liquid coolant that has passed through heat exchanger 14 and turned into a condensed saturated liquid state, thereby cooling EV equipment 31. By heat exchange with EV equipment 31, the coolant is heated to increase the dryness of the coolant. The coolant receives latent heat from EV equipment 31 and partially evaporates, thereby turning into moist vapor formed of a mixture of saturated liquid and saturated vapor (point D).

Then, the coolant flows into heat exchanger 15. The moist vapor of the coolant is cooled by heat exchange with outside air in heat exchanger 15 and thereby again condensed. When all the coolant is condensed, it turns into saturated liquid, and turns into supercooled liquid (point E) which has been supercooled by radiating sensible heat. Then, the coolant flows into expansion valve 16 through coolant passage 25. At expansion valve 16, the coolant in the supercooled liquid state is subjected to throttle expansion, and the temperature and pressure are lowered without a change in a specific enthalpy, so that low-temperature and low-pressure moist vapor in the gas-liquid mixed state is obtained (point F).

The coolant in the moist vapor state flowing out of expansion valve 16 flows into heat exchanger 18 through coolant passage 26. The coolant in the moist vapor state flows into the tube of heat exchanger 18. When flowing through the tube of heat exchanger 18, the coolant absorbs heat of the air in the vehicle cabin as latent heat of evaporation via the fin, thereby being evaporated while maintaining the equal pressure. When all the coolant turns into dry saturated vapor, the coolant vapor is further raised in temperature by sensible heat and turns into superheated vapor (point A). After that, the coolant is sucked into compressor 12 through coolant passage 27. Compressor 12 compresses the coolant flowed from heat exchanger 18.

In accordance with such a cycle, the coolant continuously repeats the state changes of compression, condensation, throttle expansion, and evaporation. In the description of the vapor compression refrigeration cycle set forth above, the theoretical refrigeration cycle is described. However, in actual vapor compression refrigeration cycle 10, loss in compressor 12, and pressure loss and heat loss in the coolant should be taken into consideration.

During the operation of vapor compression refrigeration cycle 10, the coolant absorbs heat of evaporation from the air in the vehicle cabin when it evaporates in heat exchanger 18 acting as an evaporator. Thereby, this coolant cools the vehicle cabin. In addition, the high-pressure liquid coolant, which has flowed out of heat exchanger 14 and has been separated into a gas-phase coolant and a liquid-phase coolant in gas-liquid separator 40, flows into cooling unit 30 and subjected to heat exchange with EV equipment 31, thereby cooling EV equipment 31. Utilizing vapor compression refrigeration cycle 10 for air conditioning in the vehicle cabin, the cooling device for electric equipment according to the present embodiment cools EV equipment 31 serving as a heat source mounted in the vehicle. It is desirable that the temperature required for cooling EV equipment 31 is at least lower than the upper limit value of the target temperature range as a temperature range of EV equipment 31.

Since EV equipment 31 is cooled utilizing vapor compression refrigeration cycle 10 provided for cooling a portion to be cooled in heat exchanger 18, there is no need to provide devices such as a dedicated water circulating pump or cooling fan for cooling EV equipment 31. Accordingly, since the configuration required for the cooling device for EV equipment 31 can be reduced and the device configuration can be simplified, the production cost for the cooling device can be reduced. Additionally, since there is no need to drive a power source such as a pump and a cooling fan for cooling EV equipment 31, the power consumption or drive power consumption or driving the power source is not required. Therefore, the power consumption for cooling EV equipment 31 can be reduced.

In heat exchanger 14, the coolant only has to the cooled to the state of moist vapor. In this case, the coolant in the gas-liquid mixed state is separated by gas-liquid separator 40, and only the coolant liquid in the saturated liquid state is supplied to cooling unit 30. The coolant in the moist vapor state that has received latent heat of evaporation from EV equipment 31 and partially evaporated is cooled again in heat exchanger 15. The state of the coolant is changed at a constant temperature until the coolant in the moist vapor state is condensed and completely turned into saturated liquid. Heat exchanger 15 further supercools the liquid-phase coolant to the supercool degree required for cooling the vehicle cabin. Since the supercool degree of the coolant does not need to be excessively raised, the volumes of heat exchangers 14 and 15 can be decreased. Therefore, the cooling ability for the vehicle cabin can be ensured, and heat exchangers 14 and 15 can be reduced in size, so that the cooling device that is reduced in size and advantageous for vehicle installation can be achieved.

Coolant passage 23 forming a part of the route of the coolant flowing from the outlet of heat exchanger 14 toward the inlet of expansion valve 16 is provided between heat exchanger 14 and heat exchanger 15. As a route through which the coolant flows from gas-liquid separator 40 toward expansion valve 16, coolant passage 23 not extending through cooling unit 30 and coolant passages 34, 36 and coolant passage 32 serving as a route of the coolant flowing through cooling unit 30 to cool EV equipment 31 are arranged in parallel. The cooling system of EV equipment 31 including coolant passages 34 and 36 is connected in parallel with coolant passage 23. Accordingly, only a part of the coolant flowing out of heat exchanger 14 flows into cooling unit 30. The amount of the coolant required for cooling EV equipment 31 flows through cooling unit 30, and EV equipment 31 is appropriately cooled. Therefore, EV equipment 31 can be prevented from being supercooled.

The route of the coolant flowing from heat exchanger 14 directly into heat exchanger 15 and the route of the coolant flowing from heat exchanger 14 through cooling unit 30 into heat exchanger 15 are arranged in parallel, and only a part of the coolant flows through coolant passages 34 and 36, thereby allowing reduction in pressure loss caused when the coolant flows through the cooling system of EV equipment 31. Since all the coolant does not flow into cooling unit 30, it becomes possible to reduce the pressure loss associated with the coolant flowing through cooling unit 30. Accordingly, it becomes possible to reduce the power consumption required for operating compressor 12 for circulating the coolant.

When the low-temperature and low-pressure coolant having passed through expansion valve 16 is used for cooling EV equipment 31, the ability of heat exchanger 18 to cool the air in the vehicle cabin is decreased, thereby lowering the ability to cool the vehicle cabin. In contrast, according to the cooling device for electric equipment in the present embodiment, in vapor compression refrigeration cycle 10, the high-pressure coolant discharged from compressor 12 is condensed by both of heat exchanger 14 as the first condenser and heat exchanger 15 as the second condenser. Two heat exchangers 14 and 15 are arranged between compressor 12 and expansion valve 16. Cooling unit 30 cooling EV equipment 31 is disposed between heat exchanger 14 and heat exchanger 15. Heat exchanger 15 is disposed on the route of the coolant flowing from cooling unit 30 toward expansion valve 16.

The coolant heated by latent heat of evaporation received from EV equipment 31 is sufficiently cooled in heat exchanger 15, so that the coolant has a temperature and pressure at the outlet of expansion valve 16 that are essentially required for cooling the vehicle cabin. Accordingly, it becomes possible to sufficiently increase the amount of heat received from outside when the coolant evaporates in heat exchanger 18. In this way, by setting the heat radiation ability of heat exchanger allowing sufficient cooling of the coolant, EV equipment 31 can be cooled without exerting an influence upon the ability to cool the air in the vehicle cabin. Therefore, both of the cooling ability for EV equipment 31 and the cooling ability for the vehicle cabin can be reliably ensured.

When cooling EV equipment 31, the coolant flowing from heat exchanger 14 into cooling unit 30 receives heat from EV equipment 31 and is then heated. When the coolant is heated in cooling unit 30 to a temperature equal to or higher than the saturated vapor temperature and the total amount of the coolant evaporates, the amount of heat exchange between the coolant and EV equipment 31 is decreased, thereby preventing efficient cooling of EV equipment 31 and also increasing the pressure loss caused when the coolant flows through a pipe line. Accordingly, it is desirable to sufficiently cool the coolant in heat exchanger 14 to such an extent that the total amount of the coolant does not evaporate after EV equipment 31 is cooled.

Specifically, the state of the coolant at the outlet of heat exchanger 14 is brought closer to the saturated liquid, and typically, the coolant is brought into the state on the saturated liquid line at the outlet of heat exchanger 14. As a result of allowing heat exchanger 14 to have an ability to sufficiently cool the coolant, the heat radiating ability of heat exchanger 14 to radiate heat from the coolant becomes higher than the radiating ability of heat exchanger 15. By sufficiently cooling the coolant in heat exchanger 14 having a relatively greater heat radiating ability, the coolant having received heat from EV equipment 31 can be maintained in the state of moist vapor, so that the reduction in the amount of heat exchange between the coolant and EV equipment 31 can be avoided. Therefore, EV equipment 31 can be cooled in a fully efficient manner. The coolant in the vapor moist state that has cooled EV equipment 31 is efficiently cooled again in heat exchanger 15, and cooled to the state of supercooled liquid to an extent slightly below the saturated temperature. Therefore, the cooling device for electric equipment can be provided that can ensure both the cooling ability for the vehicle cabin and the cooling ability for EV equipment 31.

The coolant in the gas-liquid two-phase state at the outlet of heat exchanger 14 is separated into a gas-phase coolant and a liquid-phase coolant within gas-liquid separator 40. The gas-phase coolant separated by gas-liquid separator 40 flows through coolant passages 23 and 24, and is directly supplied to heat exchanger 15. The liquid-phase coolant separated by gas-liquid separator 40 flows through coolant passage 34 and is supplied to cooling unit 30 for cooling EV equipment 31. This liquid-phase coolant is a coolant truly in a saturated liquid state without excess or deficiency. By extracting only the liquid-phase coolant from gas-liquid separator 40 and causing it to flow through cooling unit 30, EV equipment 31 can be cooled utilizing the ability of heat exchanger 14 to the utmost. Accordingly, the cooling device for electric equipment can be provided that allows improvement in the cooling ability for EV equipment 31.

The coolant in the saturated liquid state at the outlet of gas-liquid separator 40 is introduced into coolant passage 32 through which EV equipment 31 is cooled. Thereby, it becomes possible to minimize the coolant in the vapor-phase state among the coolants flowing through the cooling system of EV equipment 31 including coolant passages 34 and 36 and coolant passage 32. Accordingly, it can be suppressed that the flow velocity of the coolant vapor flowing through the cooling system of EV equipment 31 is raised to increase the pressure loss, thereby allowing reduction in power consumption of compressor 12 for flowing the coolant. Therefore, deterioration in performance of vapor compression refrigeration cycle 10 can be avoided.

The coolant liquid in the saturated liquid state is stored in gas-liquid separator 40. Gas-liquid separator 40 functions as a liquid storage container temporarily storing the coolant liquid in a liquid state. A prescribed amount of the coolant liquid is stored in gas-liquid separator 40, so that the flow rate of the coolant flowing from gas-liquid separator 40 into cooling unit 30 can be maintained also during load change. Gas-liquid separator 40 has a liquid reservoir function, serves as a buffer against load change and can absorb this load change. Therefore, the ability to cool EV equipment 31 can be stabilized.

Referring to FIG. 2, the cooling device for electric equipment according to the present embodiment includes a flow rate regulating valve 28. Flow rate regulating valve 28 is disposed in coolant passage 23 forming one of the passages connected in parallel in the route of the coolant flowing from heat exchanger 14 toward expansion valve 16. Flow rate regulating valve 28 changes its valve opening degree to increase or decrease the pressure loss of the coolant flowing through coolant passage 23, thereby arbitrarily adjusting the flow rate of the coolant flowing through coolant passage 23 and the flow rate of the coolant flowing through the cooling system of EV equipment 31 including coolant passage 32.

For example, when flow rate regulating valve 28 is fully closed to set its valve opening degree at 0%, the total amount of the coolant flowing out of heat exchanger 14 flows from gas-liquid separator 40 into coolant passage 34. If the valve opening degree of flow rate regulating valve 28 is increased, the coolant flowing from heat exchanger 14 into coolant passage 22 is to include a coolant increased in flow rate that flows through coolant passage 23 directly into heat exchanger 15, and a coolant decreased in flow rate that flows through coolant passage 34 into coolant passage 32 to cool EV equipment 31. If the valve opening degree of flow rate regulating valve 28 is decreased, the coolant flowing from heat exchanger 14 into coolant passage 22 is to include a coolant decreased in flow rate that flows through coolant passage 23 directly into heat exchanger 15, and a coolant increased in flow rate that flows through coolant passage 32 to cool EV equipment 31.

When the valve opening degree of flow rate regulating valve 28 is increased, the flow rate of the coolant cooling EV equipment 31 is decreased, thereby decreasing the cooling ability for EV equipment 31. When the valve opening degree of flow rate regulating valve 28 is decreased, the flow rate of the coolant cooling EV equipment 31 is increased, thereby improving the cooling ability for EV equipment 31. Since the amount of the coolant flowing through EV equipment 31 can be optimally adjusted by using flow rate regulating valve 28, supercooling of EV equipment 31 can be reliably prevented. In addition, both of the pressure loss associated with the coolant flowing through the cooling system of EV equipment 31 and the power consumption of compressor 12 for circulating the coolant can be reliably decreased.

The cooling device for electric equipment according to the present embodiment further includes a coolant passage 51. Coolant passage 51 allows communication between coolant passage 21 through which the coolant flows between compressor 12 and heat exchangers 14, and coolant passage 36 on the downstream side of cooling unit 30 among coolant passages 34 and 36 through which the coolant flows through cooling unit 30. Coolant passage 36 is divided into two passages including a coolant passage 36a on the upstream side of the branch, to coolant passage 51 and a coolant passage 36b on the downstream side of the branch to coolant passage 51.

Coolant passage 36 and coolant passage 51 each are provided with a switching valve 52 for switching the communication state between coolant passage 51 and each of coolant passages 21, 36. Switching valve 52 is switched to be opened or closed, thereby allowing or disallowing flow of the coolant flowing through coolant passage 51. By switching the route of the coolant using switching valve 52, the coolant having cooled EV equipment 31 can flow through a route arbitrarily selected from routes including a route extending through coolant passages 36b and 24 to heat exchanger 15 and a route extending through coolant passage 51 and coolant passage 21 to heat exchanger 14.

More specifically, two valves 57, 58 each are provided as switching valves 52. During the cooling operation of vapor compression refrigeration cycle 10, valve 57 is fully opened (the valve opening degree is 100%), valve 58 is fully closed (the valve opening degree is 0%) and the valve opening degree of flow rate regulating valve 28 is adjusted such that the coolant can sufficiently flow into cooling unit 30. Consequently, the coolant having cooled EV equipment 31 and flowing through coolant passage 36a can reliably flow through coolant passage 36b into heat exchanger 15.

On the other hand, while vapor compression refrigeration cycle 10 is stopped, valve 58 is fully opened, valve 57 is fully closed, and further, flow rate regulating valve 28 is fully closed. Consequently, a looped route can be formed, through which the coolant having cooled EV equipment 31 and flowing through coolant passage 36a flows through coolant passage 51 into heat exchanger 14, to circulate the coolant between cooling unit 30 and heat exchanger 14 without passing through compressor 12.

Figure 4:
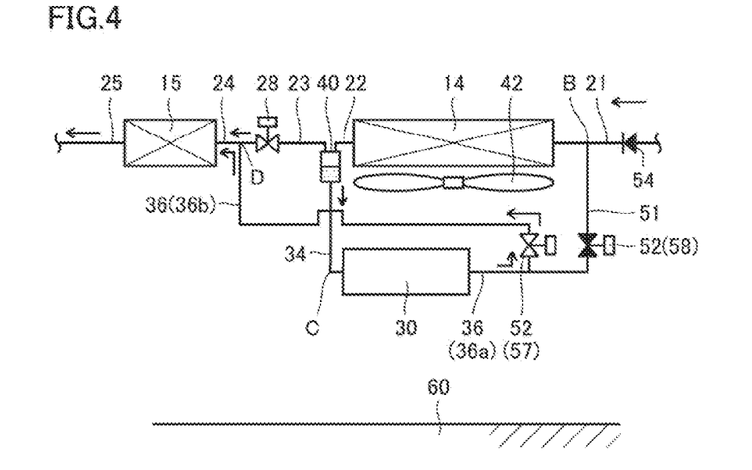
FIG. 4 schematically represents a flow of a coolant for cooling EV equipment during operation of the vapor compression refrigeration cycle.
Figure 5:
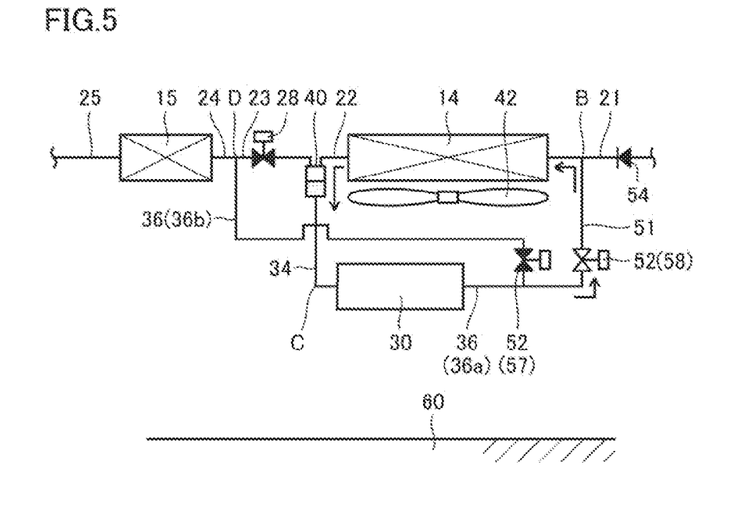
FIG. 5 schematically represents a flow of a coolant for cooling EV equipment while the vapor compression refrigeration cycle is stopped.
Figure 6:
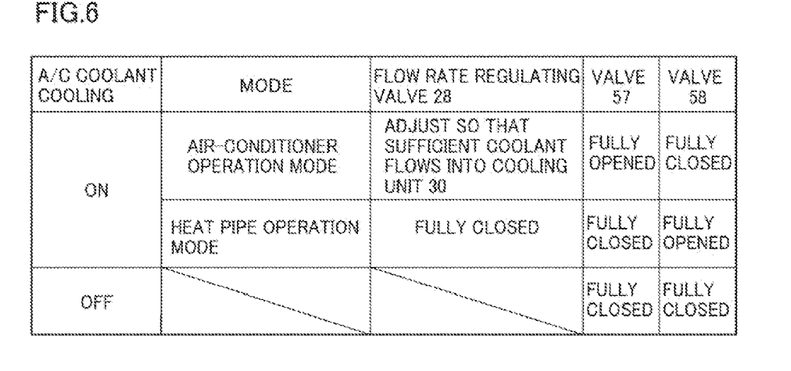
FIG. 6 represents opened and closed states of a flow rate regulating valve and a switching valve in the cooling device for electric equipment according to the embodiment of the present invention.

FIG. 4 schematically represents the flow of the coolant cooling the EV equipment during the operation of the vapor compression refrigeration cycle. FIG. 5 schematically represents the flow of the coolant cooling the EV equipment while the vapor compression refrigeration cycle is stopped. FIG. 6 represents the opened and closed states of the flow rate regulating valve and the switching valve in the cooling device for electric equipment according to the embodiment of the present invention.

The "air-conditioner operation mode" of the operation modes shown in FIG. 6 represents the case where vapor compression refrigeration cycle 10 shown in FIG. 4 is operated, that is, the case where compressor 12 is operated to circulate the coolant through the entire vapor compression refrigeration cycle 10. The "heat pipe operation mode" represents the case where vapor compression refrigeration cycle 10 shown in FIG. 5 is stopped, that is, the case where compressor 12 is stopped to circulate the coolant through the looped route connecting cooling unit 30 and heat exchanger 14.

Referring to FIGS. 4 and 6, during the "air-conditioner operation mode" in which compressor 12 is driven and vapor compression refrigeration cycle 10 is operated, the valve opening degree of flow rate regulating valve 28 is adjusted such that sufficient coolant flows into cooling unit 30. Switching valve 52 is operated to cause the coolant to flow from cooling unit 30 through heat exchanger 15 into expansion valve 16. In other words, by fully opening valve 57 and fully closing valve 58, the route of the coolant is selected such that the coolant flows through the entire cooling device. Accordingly, the cooling ability of vapor compression refrigeration cycle 10 can be ensured while EV equipment 31 can be efficiently cooled.

Referring to FIGS. 5 and 6, during the "heat pipe operation mode" in which compressor 12 is stopped and vapor compression refrigeration, cycle 10 is stopped, switching valve 52 is operated to cause the coolant to circulate from cooling unit 30 to heat exchanger 14. In other words, by fully closing valve 57, fully opening valve 58 and fully closing flow rate regulating valve 28, the coolant flows through coolant passage 51 from coolant passage 36a without flowing into coolant passage 36b. Thereby, a closed looped route is formed that extends from heat exchanger 14 sequentially through coolant passage 22 and coolant passage 34 to cooling unit 30, and further, sequentially through coolant passage 36a, coolant passage 51 and coolant passage 21 back to heat exchanger 14. The route through which the coolant flows at this time, that is, coolant passage 21, coolant passage 22, coolant passage 34, coolant passage 36a, and coolant passage 51, forms the second passage.

Thus, the coolant can be circulated through this looped route between heat exchanger 14 and cooling unit 30 without operating compressor 12. When cooling EV equipment 31, the coolant evaporates with the latent heat of evaporation received from EV equipment 31. The coolant vapor evaporated by heat exchange with EV equipment 31 flows into heat exchanger 14 sequentially through coolant passage 36a, coolant passage 51 and coolant passage 21. In heat exchanger 14, the coolant vapor is cooled and condensed by wind caused by vehicle running or draft from condenser fan 42 or the radiator fan for engine cooling. The coolant liquid liquefied in heat exchanger 14 returns to cooling unit 30 through coolant passages 22 and 34.

In this way, the looped route extending through cooling unit 30 and heat exchanger 14 forms a heat pipe including EV equipment 31 as a heating unit and heat exchanger 14 as a cooling unit. Therefore, when vapor compression refrigeration cycle 10 is stopped, that is, even when cooling for the vehicle is stopped, EV equipment 31 can be reliably cooled without having to start compressor 12. Since compressor 12 does not have to be always operated for cooling EV equipment 31, the power consumption of compressor 12 can be decreased to thereby allow improvement in fuel efficiency of the vehicle, and also allow extension of the operating life of compressor 12, so that the reliability of compressor 12 can be improved.

FIGS. 4 and 5 show a ground surface 60. Cooling unit 30 is disposed below heat exchanger 14 as seen in the vertical direction perpendicular to ground surface 60. In the looped route through which the coolant circulates between heat exchanger 14 and cooling unit 30, cooling unit 30 is disposed in the lower portion while heat exchanger 14 is disposed in the upper portion. Heat exchanger 14 is disposed at the position higher than cooling unit 30.

In this case, the coolant vapor heated and evaporated in cooling unit 30 rises through the looped route and reaches heat exchanger 14. Then, this coolant vapor is cooled and condensed in heat exchanger 14, and turns into a liquid coolant, which then goes down through the looped route by the action of gravity, and returns to cooling unit 30. In other words, a thermosyphon-type heat pipe is formed of cooling unit 30, heat exchanger 14, and a coolant route connecting them (that is, the second passage). The heat transfer efficiency from EV equipment 31 to heat exchanger 14 can be improved by forming a heat pipe. Accordingly, even when vapor compression refrigeration cycle 10 is stopped, EV equipment 31 can be more efficiently cooled without applying motive power.

As switching valve 52 for switching the state of communication between coolant passage 51 and coolant passages 21 and 36, the pair of valves 57, 58 described above may be used, or a three-way valve disposed at the branch between coolant passage 36 and coolant passage 51 may be used. In either cases, EV equipment 31 can be cooled efficiently both during operation of vapor compression refrigeration cycle 10 and while vapor compression refrigeration cycle 10 is stopped. Valves 57, 58 can be inexpensive since the valves only have to have a simple structure allowing the coolant passage to be opened and closed. By using two valves 57, 58, a relatively low-cost cooling structure for electric equipment can be provided. On the other hand, it is considered that the space required for arranging the three-way valve may be smaller than the space required for arranging two valves 57, 58. Thus, by using such a three-way valve, a cooling structure for electric equipment can be provided that is further reduced in size and excellent in vehicle mountability.

The cooling structure for electric equipment according to the present embodiment further includes a check valve 54. Check valve 54 is disposed in coolant passage 21 between compressor 12 and heat exchanger 14 on the side closer to compressor 12 than to the connection portion between coolant passage 21 and coolant passage 51. Check valve 54 allows the coolant to flow from compressor 12 toward heat exchanger 14, but inhibits the coolant from flowing in the direction opposite thereto. In this way, it becomes possible to reliably form a closed-loop coolant route through which the coolant is circulated between heat exchanger 14 and cooling unit 30 during the heat pipe operation mode shown in FIG. 5.

If check valve 54 is not provided, the coolant may flow from coolant passage 51 into coolant passage 21 on the compressor 12 side. By providing check valve 54, the flow of the coolant flowing from coolant passage 51 toward compressor 12 can be reliably inhibited. Accordingly, the cooling ability for EV equipment 31 using a heat pipe formed by a looped coolant route can be prevented from decreasing while vapor compression refrigeration cycle 10 is stopped. Therefore, EV equipment 31 can be efficiently cooled also when cooling for the vehicle cabin is stopped.

Furthermore, when the amount of the coolant within the closed-loop coolant route becomes insufficient while vapor compression refrigeration cycle 10 is stopped, compressor 12 is operated only for a short time period, so that the coolant can be supplied through check valve 54 into the closed-loop route. Consequently, the amount of the coolant within the closed loop can be increased to increase the processing amount of heat exchange of the heat pipe. Therefore, since the amount of the coolant in the heat pipe can be ensured, it becomes possible to avoid insufficient cooling of EV equipment 31 resulting from shortage of the coolant amount.

In other words, the cooling device for electric equipment according to the present embodiment constitutes a vapor compression refrigeration cycle, and includes coolant passages 21 to 27 as circulation passages through which the vehicle air-conditioning coolant circulates, coolant passages 34, 36, and 51 as communication passages allowing communication between coolant passages 21 to 27 and coolant passage 32, and switching valve 52 (valve 57 and valve 58) provided in the routes of coolant passages 34, 36, 51 and allowing or blocking the coolant flow between coolant passages 21 to 27 and coolant passage 32.

Figure 7:
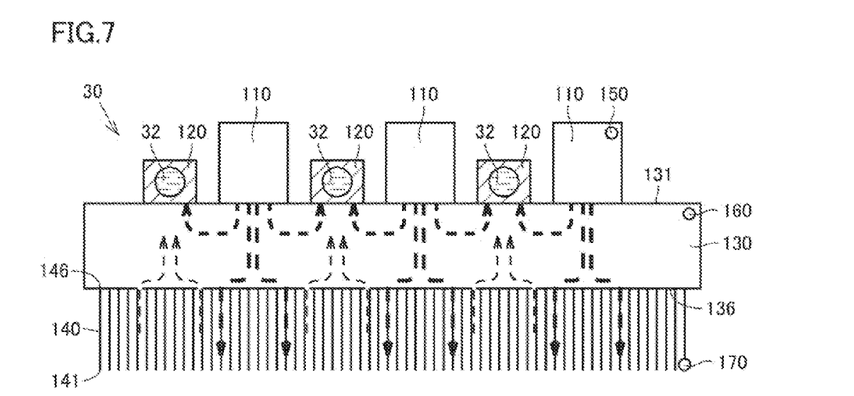
FIG. 7 is a cross-sectional view representing a structure of the cooling unit shown in FIG. 2.

FIG. 7 is a cross-sectional view representing a structure of the cooling unit shown in FIG. 2. Referring to FIG. 7, cooling unit 30 includes a heat mass 130, an air-cooling fin 140, and an A/C (Air Conditioner) coolant pipeline 120.

Heat mass 130 is formed of material exhibiting excellent heat conductivity. Heat mass 130 is formed of metal such as aluminum or copper. Heat mass 130 is formed to have an approximately cubic shape. Heat mass 130 has a surface 131 and a back surface 136 disposed on a back side thereof. Surface 131 and back surface 136 extend in parallel with each other. Not limited to this, surface 131 and back surface 136 may be formed so as to meet each other on an extension of these extending surfaces.

A plurality of inverter elements 110 are provided on surface 131. When EV equipment 31 shown in FIG. 2 is an inverter, inverter elements 110 are provided as heat sources included in the inverter. The plurality of inverter elements 110 are disposed on surface 131 while being spaced apart from each other. The plurality of inverter elements 110 are disposed at equal intervals.

A plurality of air-conditioner coolant pipelines 120 are further provided on surface 131. Air-conditioner coolant pipelines 120 form coolant passages 32 shown in FIG. 2. Air-conditioner coolant pipelines 120 are disposed between inverter elements 110 which are adjacent to each other. Each air-conditioner coolant pipeline 120 is disposed at a position equally spaced from two inverter elements 110 provided on both sides.

Air-cooling fins 140 are provided on back surface 136. Air-cooling fins 140 are formed of material exhibiting excellent heat conductivity. Air-cooling tins 140 are formed of metal such as aluminum or copper. Air-cooling fins 140 protrude from back surface 136 and extend in the direction of leaving apart from heat mass 130. Each air-cooling fin 140 has a base portion 146 connected to back surface 136 and a leading end portion 141 provided at a leading end protruding from back surface 136. When back surface 136 is viewed from a front side, air-cooling fins 140 are provided at a region overlapping with the region where the plurality of inverter elements 110 are provided. Wind caused by vehicle running or draft from a fan not illustrated in the drawing is supplied as cooling air to air-cooling fins 140.

A distance between inverter element 110 and air-conditioner coolant pipeline 120 is smaller than a distance between air-cooling fin 140 and air-conditioner coolant pipeline 120.

As EV equipment 31 operates, the plurality of inverter elements 110 generate heat. The heat generated by inverter elements 110 is transferred through heat mass 130 and air-cooling fin 140, and then radiated to the cooling air supplied to air-cooling fins 140. Further, the heat generated by inverter elements 110 is transferred through heat mass 130 and air-conditioner coolant pipelines 120, and then radiated to the coolant flowing through coolant passage 32. In other words, in the cooling device for electric equipment according to the present embodiment, cooling with use of air-cooling fins 140 (fin cooling) and cooling with use of the coolant for vehicle cabin air-conditioning flowing through coolant passage 32 (A/C coolant cooling) are used concurrently for cooling of EV equipment 31.

Figure 8:
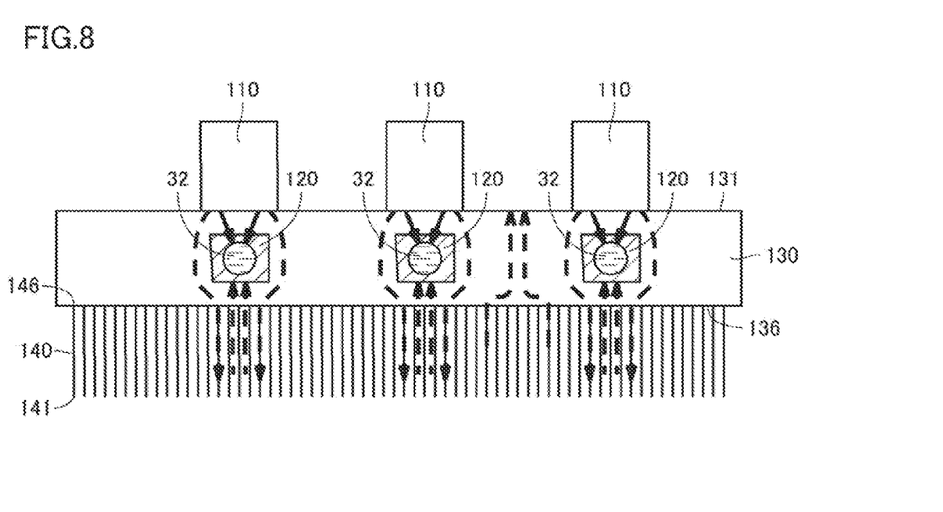
FIG. 8 is a cross-sectional view representing a structure of the cooling unit for comparison.

FIG. 8 is a cross-sectional view representing a structure of a cooling unit for comparison. Referring to FIG. 8, in the present comparative example, air-conditioner coolant pipelines 120 are provided within heat mass 130. A plurality of inverter elements 110 are provided on surface 131, and a plurality of air-cooling fins 140 are provided on back surface 136. Air-conditioner coolant pipelines 120 are disposed between inverter elements 110 and air-cooling fins 140.

In the comparative example having such configuration, air-conditioner coolant pipelines 120 and air-cooling fins 140 are arranged on the same side when viewed from inverter elements 110. The temperature of the coolant flowing through air-conditioner coolant pipelines 120 is lower than the temperature of the cooling air supplied to air-cooling fins 140. Therefore, in this case, the coolant flowing through air-conditioner coolant pipeline 120 not only absorbs heat generated by inverter elements 110 but also absorbs a large amount of cooling air (air) supplied to air-cooling fins 140. Consequently, there is a concern that the effect of the A/C coolant cooling of radiating heat generated by inverter elements 110 is impaired.

Referring to FIG. 7, on the other hand, in the cooling device for electric equipment according to the present embodiment, air-conditioner coolant pipelines 120 and air-cooling fins 140 are arranged on opposite sides across heat mass 130, and air-conditioner coolant pipelines 120 and inverter elements 110 are arranged on the same side. With such configuration, while suppressing the radiation of heat from air-cooling fins 140 to the coolant flowing through air-conditioner coolant pipelines 120, radiation of heat from inverter elements 110 to the coolant flowing through air-conditioner coolant pipelines 120 can be prompted. Accordingly, the cooling efficiency of EV equipment 31 during cooling of the A/C coolant can be improved.

Figure 9:
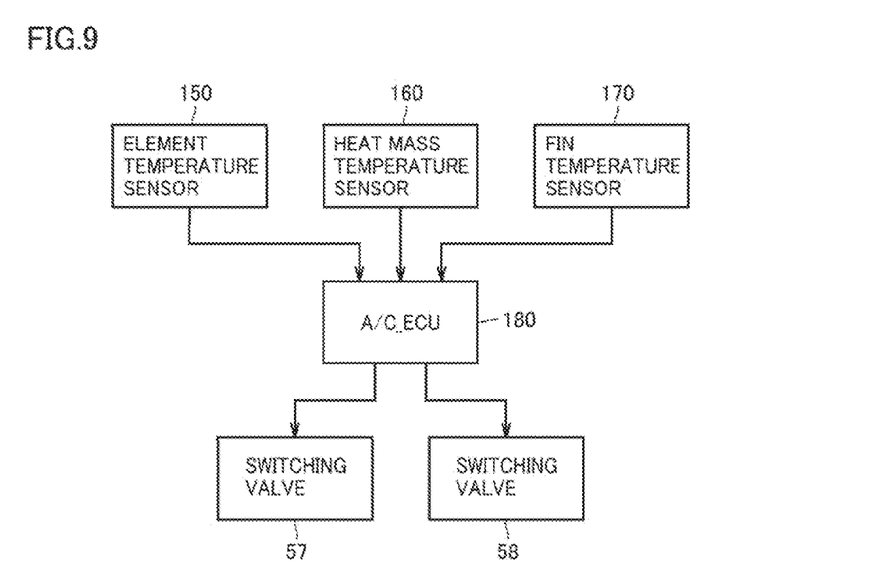
FIG. 9 is a block diagram representing a control system of the cooling device for electric equipment according to the embodiment of the present invention.

FIG. 9 is a block diagram representing a control system of the cooling device for electric equipment according to the embodiment of the present invention.

Referring to FIGS. 7 and 9, the cooling device for electric equipment according to the present embodiment has an A/C_ECU (Electronic Control Unit) 180, an element temperature sensor 150, a heat mass temperature sensor 160, and a fin temperature sensor 170.

A/C_ECU 180 controls an air conditioner (A/C, Air Conditioner) mounted in a vehicle and controls the A/C coolant cooling for cooling EV equipment 31. Element temperature sensor 150 is provided at inverter elements 110 to measure the temperature of inverter elements 110. Heat mass temperature sensor 160 is provided at heat mass 130 to measure the temperature of heat mass 130. Fin temperature sensor 170 is provided at air-cooling fins 140 to measure the temperature of air-cooling fins 140.

In the present embodiment, heat mass temperature sensor 160 is provided in the vicinity of surface 131. A distance between heat mass temperature sensor 160 and surface 131 is smaller than a distance between heat mass temperature sensor 160 and back surface 136. Further, fin temperature sensor 170 is provided at leading end portion 141 of air-cooling fin 140 protruding from back surface 136. Accordingly, while overcoming an influence of cooling by the coolant flowing through A/C coolant pipelines 120, the temperature of air-cooling fins 140 can be measured.

Figure 10:
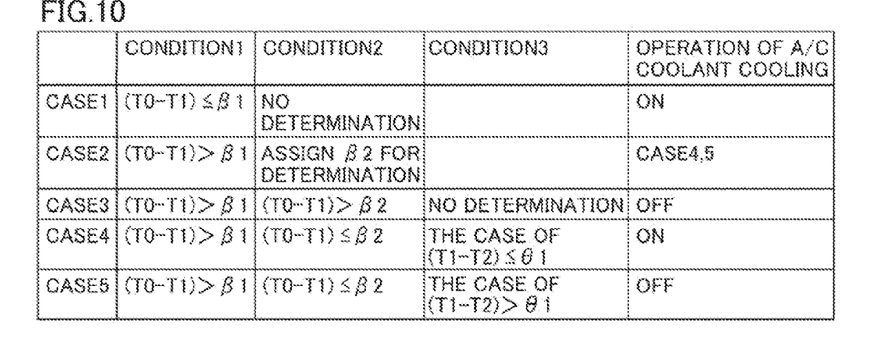
FIG. 10 is a table representing operation conditions of cooling with an A/C coolant.
Figure 11:
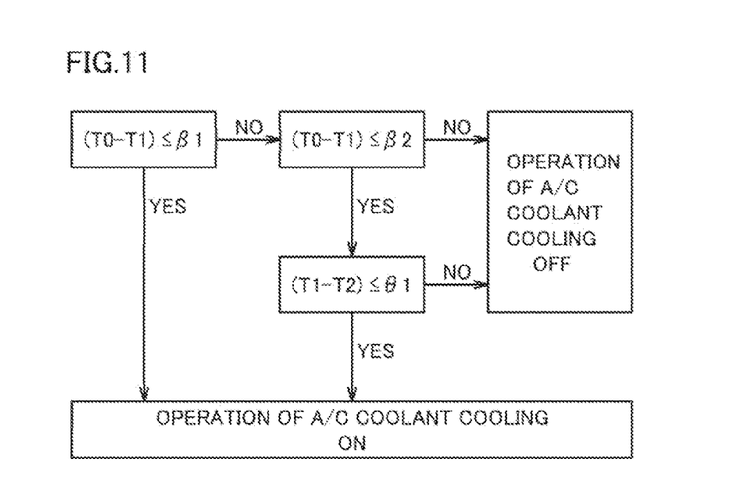
FIG. 11 is a flowchart representing a control flow of cooling with the A/C coolant.

FIG. 10 is a table representing operation conditions for the A/C coolant cooling. FIG. 11 is a flowchart representing a control flow during the A/C coolant cooling.

Referring to FIGS. 6, 10, and 11, in the cooling structure of electric equipment according to the present embodiment, operation of the A/C coolant cooling is controlled based on the temperature of inverter elements 110, heat mass 130, and air-cooling fins 140 measured respectively by element temperature sensor 150, heat mass temperature sensor 160, and fin temperature sensor 170.

Specifically, firstly, a temperature T0 of inverter elements 110 and a temperature T1 of heat mass 130 are measured respectively by element temperature sensor 150 and heat mass temperature sensor 160. A/C_ECU 180 determines whether or not a difference between temperature T0 of inverter elements 110 and temperature T1 of heat mass 130 (T0-T1) is less than or equal to a predetermined value β1. When (T0-T1)≤β1 is met, A/C_ECU 180 fully opens valve 57 and fully closes valve 58 during the air-conditioner operation mode, and fully closes valve 57 and fully opens valve 58 during the heat pipe operation mode, thereby operating the air-conditioner coolant cooling (CASE 1). On the other hand, when (T0-T1)>β1 is met, it proceeds to the next flow (CASE 2).

Next, A/C_ECU 180 determines whether or not a difference between temperature T0 of inverter elements 110 and temperature T1 of heat mass 130 (T0-T1) is less than or equal to a predetermined value β2 (≈2 is a value greater than β1). When (T0-T1)≤β2 is met, A/C_ECU 180 fully closes valve 57 and valve 58 and stops operation of the air-conditioner coolant cooling (CASE 3). When (T0-T1)≤β2 is met, it proceeds to the next flow.

Next, temperature T1 of heat mass 130 and a temperature T2 of air-cooling fins 140 are measured respectively by heat mass temperature sensor 160 and fin temperature sensor 170. A/C_ECU 180 determines whether or not a difference between temperature T1 of heat mass 130 and temperature T2 of air-cooling fins 140 (T1-T2 is less than or equal to a predetermined value θ1. When (T1-T2)≤θ1 is met, A/C_ECU 180 fully opens valve 57 and fully closes valve 58 during the air-conditioner operation mode, and fully closes valve 57 and fully opens valve 58 during the heat pipe operation mode and operates the air-conditioner coolant cooling (CASE 4). On the other hand, when (T1-T2)>θ1 is met A/C_ECU 180 fully closes valve 57 and valve 58, and stops operation of the air-conditioner coolant cooling (CASE 5).

According to such configuration, basically, the heat generated by inverter elements 110 is radiated by the fin cooling with use of air-cooling fins 140, and the air-conditioner coolant cooling is operated only when the cooling ability is not sufficient only with the fin cooling or when the outside temperature is high. Accordingly, as compared with the case of always using the air-conditioner coolant cooling, the utilization efficiency of energy can be improved, and deterioration in fuel consumption of the vehicle and lowering in the cooling performance can be avoided.

In the present embodiment, the operation of the air-conditioner coolant cooling is stopped in CASE 3 and CASE 5. However, when the mode of air-conditioner coolant cooling is in the heat pipe operation mode, the air-conditioner coolant cooling may be continued.

Summarizing the structure of the cooling device for electric equipment according to the embodiment of the present invention described above, the cooling device for electric equipment according to the present embodiment is a cooling device for EV equipment 31 as electric equipment mounted in a vehicle. The cooling device for electric equipment includes cooling unit 30 for cooling inverter elements 110 as heat sources included in EV equipment 31. Cooling unit 30 has surface 131 as a first surface on which inverter elements 110 are provided and back surface 136 as a second surface disposed on a back side of surface 131, and includes heat mass 130 as a heat transfer member transferring heat generated at inverter elements 110, air-cooling fins 140 serving as fin portions provided on back surface 136 and radiating heat transferred through heat mass 130, and air-conditioner coolant pipelines 120 serving as coolant passage forming members provided on surface 131 and forming coolant passages 32 through which the cabin air-conditioning coolant flows.

According to the cooling structure for electric equipment according to the embodiment of the present invention, air-conditioner coolant pipelines 120 are provided in the vicinity of inverter elements 110 and at position far apart from air-cooling fins 140, so that the cooling efficiency of EV equipment 31 during the A/C coolant cooling can be improved. Further, the operation of the A/C coolant cooling is controlled based on the temperature of inverter elements 110, heat mass 130, and air-cooling fins 140, so that the A/C coolant cooling can be efficiently utilized as means for supporting the fin cooling.

It should be noted that the cooling device for electric equipment using the air-conditioner coolant to which the present invention is applied is not limited to the cooling system shown in FIG. 2. For example, the cooling system may omit heat exchanger 15 by providing heat exchanger 14 with the cooling ability to supercool the coolant, or the cooling system may be provided with a heat exchanger in parallel with heat exchanger 18 to absorb the heat of the ambient air for the purpose different from that of heat exchanger 18.

Further, the cooling device for electric equipment according to the present invention can be applied not only to a hybrid vehicle having an engine and an electric motor as motive power sources but also to an electric vehicle having only an electric motor as a motive power source.

It should be understood that the embodiments disclosed herein are illustrative and non-restrictive in every respect. The scope of the present invention is defined by the terms of the claims, and is intended to include any modifications within the scope and meaning equivalent to the terms of the claims.

INDUSTRIAL APPLICABILITY

This invention is applied to vehicles such as a hybrid vehicle and an electric vehicle provided with electric equipment such as a motor generator and an inverter

REFERENCE SIGNS LIST 10 vapor compression refrigeration cycle; 12 compressor; 14 and 15, 18 heat exchanger; 16 expansion valve; 21, 22, 23, 24, 25, 26, 27, 32, 34, 36, 36a, 36b, 51 coolant passage 28 flow rate regulating valve, 30 cooling unit; 31 EV equipment; 40 gas-liquid separator; 42 condenser fan; 52 switching valve; 54 check valve; 57, 58 valve; 60 ground surface; 90 duct; 91 duct inlet; 92 duct outlet; 93 fan; 100 engine; 110 inverter element; 120 air-conditioner coolant pipeline; 120 A/C coolant pipeline; 130 heat mass; 131 surface; 136 back surface; 140 air-cooling fin; 141 leading end portion; 146 base portion; 150 element temperature sensor; 160 heat mass temperature sensor; 170 fin temperature sensor; 200 drive unit; 400 driving battery; 500, 600 cable; 1000 vehicle.

The invention claimed is:
1. A cooling device for electric equipment mounted in a vehicle, the cooling device comprising:
a cooling unit configured to cool a heat source included in the electric equipment, the cooling unit including:
a heat transfer member having a first surface provided at the heat source and a second surface arranged on a back side of the first surface that transfers heat generated in the heat source;

a fin portion provided at the second surface, the fin portion radiating heat transferred through the heat transfer member, the fin portion and the heat source being arranged on opposite sides across the heat transfer member; and a coolant passage forming member provided at the first surface, the coolant passage forming member forming a coolant passage that allows a coolant for vehicle cabin air-conditioning to flow, the coolant passage forming member and the fin portion being arranged on opposite sides across the heat transfer member;

a circulation passage constituting a vapor compression refrigeration cycle, the circulation passage allowing a coolant for vehicle air-conditioning to circulate;

a communication passage allowing communication between the circulation passage and the coolant passage;

a switching valve provided on a route of the communication passage and permits or blocks a coolant flow between the circulation passage and the coolant passage;

a first temperature measurement unit configured to measure a temperature of the heat source;

a second temperature measurement unit configured to measure a temperature of the heat transfer member; and a controller programmed to control an operation of the switching valve based on a temperature $T0$ of the heat source and a temperature $T1$ of the heat transfer member that are measured respectively by the first temperature measurement unit and the second temperature measurement unit, wherein:

the controller operates the switching valve so that a coolant flow between the circulation passage and the coolant passage is permitted when a value of $T0-T1$ is less than or equal to $\beta 1$ ($\beta 1$ is a preset threshold value).

2. A cooling device for electric equipment mounted in a vehicle, the cooling device comprising:

a cooling unit configured to cool a heat source included in the electric equipment, the cooling unit including:

a heat transfer member having a first surface provided at the heat source and a second surface arranged on a back side of the first surface that transfers heat generated in the heat source;

a fin portion provided at the second surface, the fin portion radiating heat transferred through the heat transfer member, the fin portion and the heat source being arranged on opposite sides across the heat transfer member; and a coolant passage forming member provided at the first surface, the coolant passage forming member forming a coolant passage that allows a coolant for vehicle cabin air-conditioning to flow, the coolant passage forming member and the fin portion being arranged on opposite sides across the heat transfer member;

a circulation passage constituting a vapor compression refrigeration cycle, the circulation passage allowing a coolant for vehicle air-conditioning to circulate;

a communication passage allowing communication between the circulation passage and the coolant passage;

a switching valve provided on a route of the communication passage and permits or blocks a coolant flow between the circulation passage and the coolant passage;

a second temperature measurement unit configured to measure a temperature of the heat transfer member;

a third temperature measurement unit configured to measure a temperature of the fin portion; and a controller programmed to control an operation of the switching valve based on a temperature $T1$ of the heat transfer member and a temperature $T2$ of the fin portion that are measured respectively by the second temperature measurement unit and the third temperature measurement unit, wherein:

the controller operates the switching valve so that a coolant flow between the circulation passage and the coolant passage is permitted when a value of $T1-T2$ is less than or equal to $\theta 1$ ($\theta 1$ is a preset threshold value).

3. The cooling device for electric equipment according to claim 2, wherein:

the fin portion protrudes from the second surface, and the third temperature measurement unit is provided at a leading end of the fin portion protruding from the second surface.

4. The cooling device for electric equipment according to claim 1, wherein:

the electric equipment includes a plurality of heat sources, and the coolant passage forming member is arranged between the plurality of heat sources that are arranged adjacent to each other.

5. The cooling device for electric equipment according to claim 2, wherein:

the electric equipment includes a plurality of heat sources, and the coolant passage forming member is arranged between the plurality of heat sources that are arranged adjacent to each other.

* * * * *